(12) United States Patent
Collins

(10) Patent No.: US 6,723,219 B2
(45) Date of Patent: Apr. 20, 2004

(54) METHOD OF DIRECT ELECTROPLATING ON A LOW CONDUCTIVITY MATERIAL, AND ELECTROPLATED METAL DEPOSITED THEREWITH

(75) Inventor: Dale W. Collins, Boise, ID (US)

(73) Assignee: Micron Technology, Inc., Boise, ID (US)

(*) Notice: Subject to any disclaimer, the term of this patent is extended or adjusted under 35 U.S.C. 154(b) by 36 days.

(21) Appl. No.: 09/938,645

(22) Filed: Aug. 27, 2001

(65) Prior Publication Data

US 2003/0038036 A1 Feb. 27, 2003

(51) Int. Cl.$^7$ ................................. C25D 5/18
(52) U.S. Cl. ................. 205/103; 205/157; 205/291; 205/296; 205/125; 205/920
(58) Field of Search ................. 205/103, 107, 205/157, 291, 296, 125, 920

(56) References Cited

U.S. PATENT DOCUMENTS

| | | |
|---|---|---|
| 5,972,192 A | 10/1999 | Dubin et al. |
| 6,071,398 A | 6/2000 | Martin et al. |
| 6,261,433 B1 * | 7/2001 | Landau .................. 205/96 |
| 2001/0054557 A1 * | 12/2001 | Taylor et al. ............ 205/103 |
| 2002/0053518 A1 * | 5/2002 | Matsuki et al. .......... 205/291 |
| 2002/0074234 A1 * | 6/2002 | Dubin et al. ............ 205/182 |

OTHER PUBLICATIONS

"Pulsed Electrodeposition of Copper Metallization from an Alkaline Bath," Electrochemical Society Proceedings vol. 98–6, Krishnamoorthy et al., pp. 185–194, no date available.

* cited by examiner

Primary Examiner—Wesley A. Nicolas
(74) Attorney, Agent, or Firm—Dickstein Shapiro Morin & Oshinsky LLP

(57) ABSTRACT

A method of electroplating metal onto a low conductivity layer combines a potential or current reversal waveform with variation in the amplitude and duration of the applied potential or current pulse. The method includes, over time, varying the duration of the pulse and continuously decreasing the amplitude of both the cathodic and anodic portions of the waveform across the surface of the low conductivity layer as the deposition zone moves from the center of the surface of the low conductivity layer to the outside edge. By virtue of the ability to vary the amplitude and duration of the pulse, the method facilitates the filling of structures in the center of the low conductivity layer without overdepositing on the outside edge, thus ensuring a controlled deposition of material across the surface of the low conductivity layer.

28 Claims, 16 Drawing Sheets

METHOD OF DIRECT ELECTROPLATING ON A LOW CONDUCTIVITY MATERIAL, AND ELECTROPLATED METAL DEPOSITED THEREWITH

BACKGROUND OF THE INVENTION

1. Field of the Invention

This invention relates generally to the field of electroplating. The invention relates more specifically to a method of electroplating, and a layer of electroplated material deposited therewith, that are suitable for deposition on a low conductivity substrate material.

2. Description of the Related Art

Various difficulties are associated with the electroplating of metals such as copper onto low conductivity barrier materials such as Ta and W. In the context of semiconductor fabrication, the major problem associated with plating on such barriers is that of achieving the required adhesion and uniformity of the electroplated layer across the surface of a wafer without the presence of fill defects.

Pulse plating, such as that disclosed in U.S. Pat. No. 5,972,192 to Dubin et al., has historically been employed to plate difficult-to-plate materials or shapes. While conventional pulse plating techniques can enable conformal plating across a surface under certain circumstances, for the following reason these techniques are not always effective for plating a resistive layer.

The electrical current is proportional to the voltage applied at a particular point (generally described by the Butler-Volmer Equation) as follows:

$$i = nFAk^o[C_o(0,t)e^{-\alpha nf(E-E^{o'})} - C_r(0,t)e^{-(1-\alpha)nf(E-E^{o'})}].$$

Since the current is logarithmic with the applied potential (typically called overpotential $E-E^{o'}$, where E is the applied voltage and $E^{o'}$ is the formal potential defining the thermodynamic equilibrium point in a particular electrolyte), the potential needed to be applied to the edge of an object in order to plate metal at the center of the object is well above that which is needed for plating at the edge of the object near the contact point. The waveform creates zones of excess plating toward the outside of the object, optimal growth rate in a finite region of the object, and no plating at the center of the object during the typical waveform (excluding the initial amplitudes). Therefore, with conventional techniques, the electroplated deposits are typically excessively thick at the edge of an object, such as a wafer, with minimal deposition at the center. Typical electroplating for wafers is accomplished with a dielectric material placed between the anode and cathode to modify the electric field.

In an attempt to overcome the non-uniform deposition, a high pulse amplitude technique has been employed. While the use of a high pulse amplitude may provide a more uniform deposit, it will also lead to filling problems in the high aspect ratio features common to semiconductor processes. To overcome such filling problems, the use of a current reversal waveform can be employed. The current reversal waveform can deplate metal from the regions that are thicker, or deplate the thicker regions more quickly than the thin center portions, and therefore increase the fill of high aspect ratio features. For example, U.S. Pat. No. 6,071,398 to Martin et al. discloses a method of pulse plating in which the ratio of peak reverse current density to peak forward current density is varied in periodic cycles. Martin, which focuses on achieving bottom up fill, discloses that the ratio is varied sequentially between first, second, and third values.

Electroplating a layer of metal on a layer of low conductivity material, however, presents another obstacle. With the low conductivity material, the IR drop across the surface of the low conductivity material means that the filling is limited to a small portion of the surface where the potential is defined by a narrow window.

Therefore, a need exists for a method of electroplating which not only provides for the uniform filling of high aspect ratio features, but which also provides for the controlled deposition of a layer of desired structure and thickness across the entire surface of a low conductivity material.

BRIEF SUMMARY OF THE INVENTION

The present invention provides a method of electroplating, and a layer of electroplated metal deposited therewith, that are suitable for deposition on a layer of low conductivity material. More specifically, the present invention provides a method of electroplating and the resultant layer of electroplated metal that are characterized by the controlled deposition of a metal layer of desired structure and thickness across the entire surface of the low conductivity layer.

Accordingly, the present invention relates to a method of electroplating metal onto a low conductivity layer that combines a potential or current reversal waveform with variation in the amplitude and duration of the applied potential or current pulse. The method comprises, over time, varying the duration of the pulse and continuously decreasing the amplitude of both the cathodic and anodic portions of the waveform across the surface of the low conductivity layer as the deposition zone moves from the center of the surface of the low conductivity layer to the outside edge of the surface of the low conductivity layer. The method thus advantageously uses the variable potential associated with the IR differential from the center to the edge of the low conductivity layer.

By virtue of the ability to vary the amplitude and duration of the applied potential or current pulse, the method facilitates the filling of structures in the center of the low conductivity layer without overdepositing on the outside edge, thus ensuring a predetermined profile of deposited material across the entire surface of the low conductivity layer.

BRIEF DESCRIPTION OF THE DRAWINGS

Other features and advantages of the present invention will become more fully apparent from the following detailed description of the exemplary embodiments of the invention which are provided in connection with the accompanying drawings.

DETAILED DESCRIPTION OF THE INVENTION

The present invention will be understood from the exemplary embodiments described herein.

The present invention relates to a method of electroplating metal onto a layer of low conductivity material. The method is particularly useful for the filling of structures in the center surface of the low conductivity layer without overdepositing on the outside edge, thus ensuring a controlled profile from deposition of the material across the entire surface of the low conductivity layer. The method provides a structure, such as for example, a semiconductor wafer or a chip produced therefrom, comprising a substrate, a low conductivity layer, and a uniform layer of electroplated metal deposited on the low conductivity layer.

Figure 1:
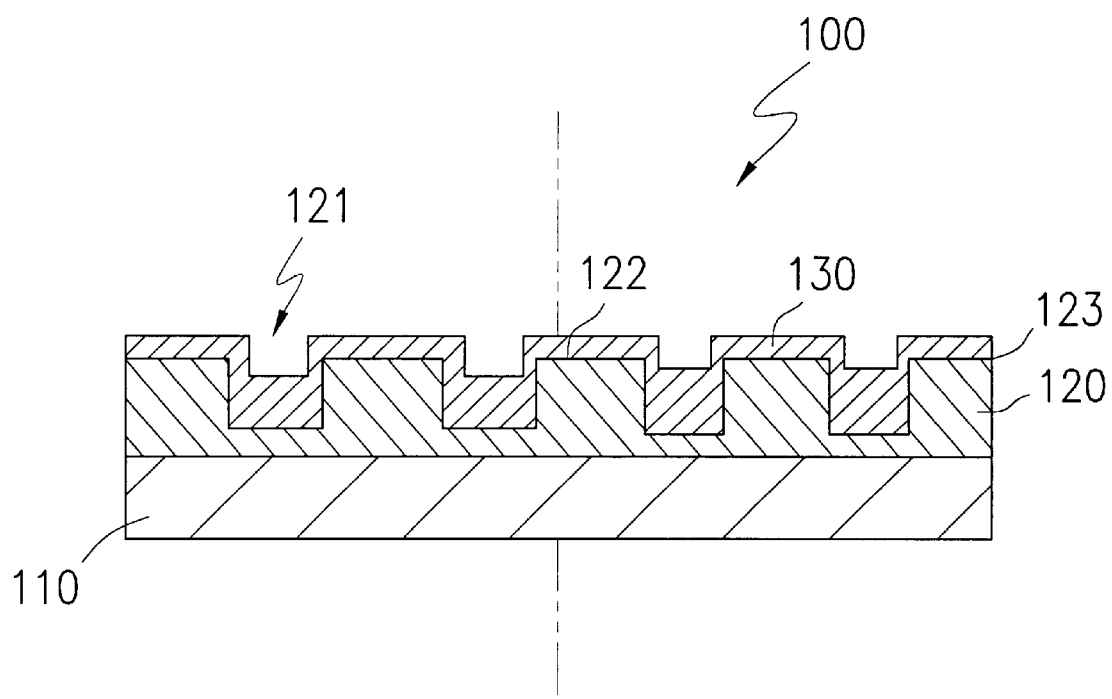
FIG. 1 is a partial cross-sectional view of a wafer having a metal layer deposited in accordance with the present method of electroplating.

FIG. 1 is a partial cross-sectional view of a semiconductor wafer 100 having a substrate 110 and a metal layer 130 deposited on a low conductivity layer 120 in accordance with the present invention. The low conductivity layer 120 may be barrier layer, such as for example, a layer of material selected from the group consisting of Ta, W, TaN/Ta, TaN, WN, W/WN, TaSiN, and TiSiN as is typically employed in a semiconductor chip to prevent alloying and copper migration during metallization thermal cycling. The low conductivity layer 120 may include a high aspect ratio feature, such as a trench, that is an at least partially filled damascene feature 121. Wafer 100 may also include fabricated circuit elements in and/or on substrate 110 and beneath the low conductivity layer 120 which are not illustrated for purposes of simplicity.

Figure 8:
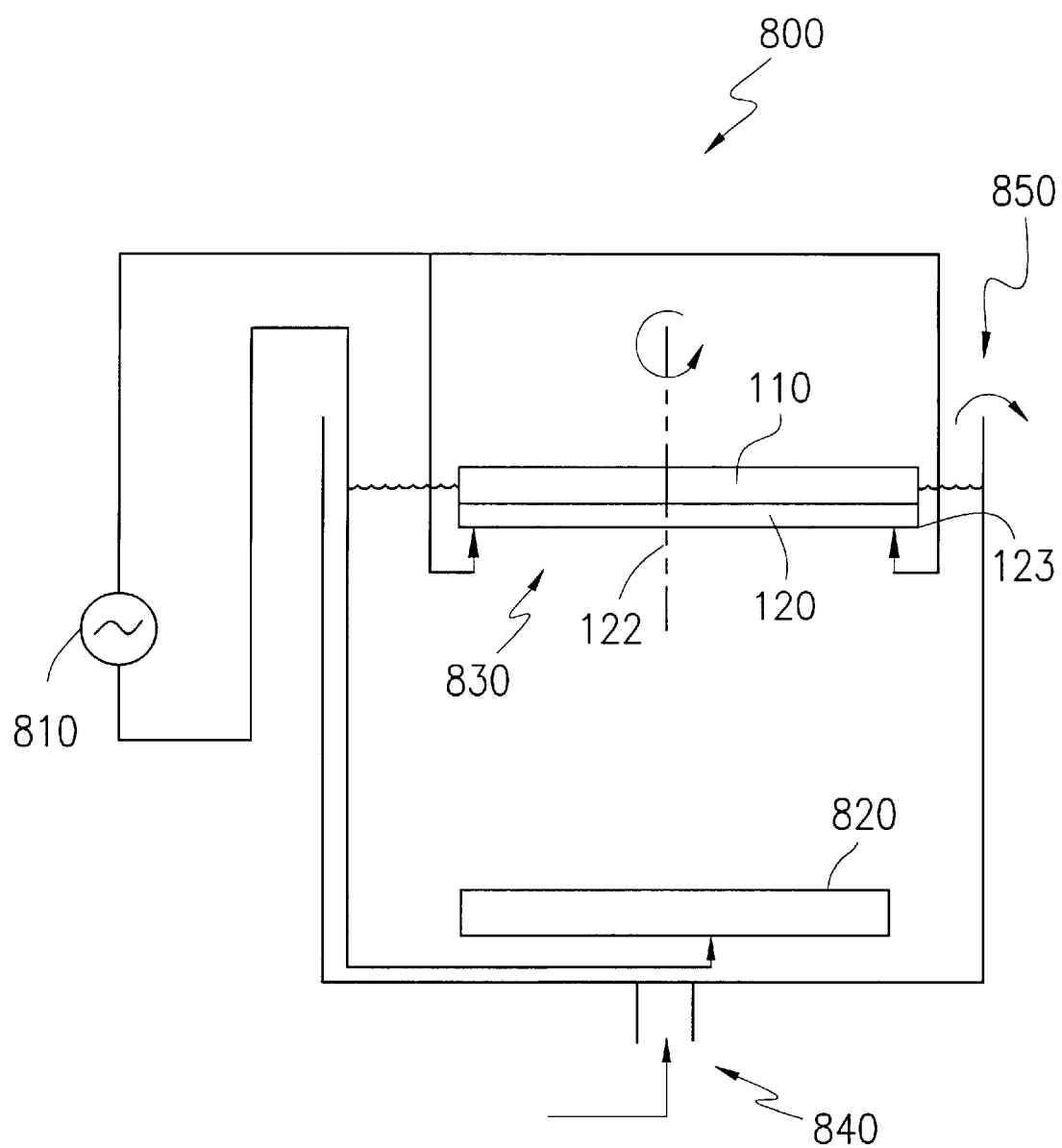
FIG. 8 is a schematic diagram of the electroplating cell employed in the present method.

FIG. 8 is a schematic view of the electroplating cell 800 employed in the present method, the details of the electroplating cell being well known in the art. Electroplating cell 800 includes generally a voltage source 810, an anode 820, i.e., a donor metal (which may be inert and decompose the electrolyte to balance electron transfer), and a cathode 830 which includes the metal upon which the electrodeposition occurs. Cathode 830 (described above as wafer 100) initially includes the substrate 110 and the low conductivity layer 120. Cell 800 typically includes a fluid inlet 840 and a fluid outlet 850 to provide for steady state cell operation. The electroplating process may include rotation of the cathode 830 to facilitate the controlled deposition.

As indicated above in the Background section, electrical current is proportional to the voltage applied at a particular point on the surface of the electrode as generally described by the Butler-Volmer equation. Since the current is logarithmic with the applied potential, when a low conductivity material is employed as the material upon which electrodeposition is to occur, the potential needed at the edge of the wafer to plate metal at the center of the low conductivity layer is well above that which is needed at the edge of the wafer for plating at the edge of the low conductivity layer near the contact point. A typical conventional waveform will creates zones of excess plating toward the outside of the object, optimal growth rate in a finite region of the object, and no plating at the center of the object (excluding the initial amplitudes). Therefore, with conventional techniques, the electroplated deposits are typically excessively thick at the edge of an object, with minimal deposition at the center.

To overcome this drawback, a first embodiment of the present method utilizes the combination of two elements: a potential reversal waveform, and variation in the amplitude and duration of the applied potential pulse. The method, therefore, advantageously uses the variable potential associated with the IR differential from the center to the edge of the low conductivity layer. The first element of the method includes applying a pulsed periodic reverse potential comprising a sequential forward to reverse, reverse to forward, continuously repeating pulsing sequence across the electrodes of the electroplating cell. The pulsing sequence utilizes a potential reversal waveform having a peak reverse potential density and a peak forward potential density.

Figure 4:
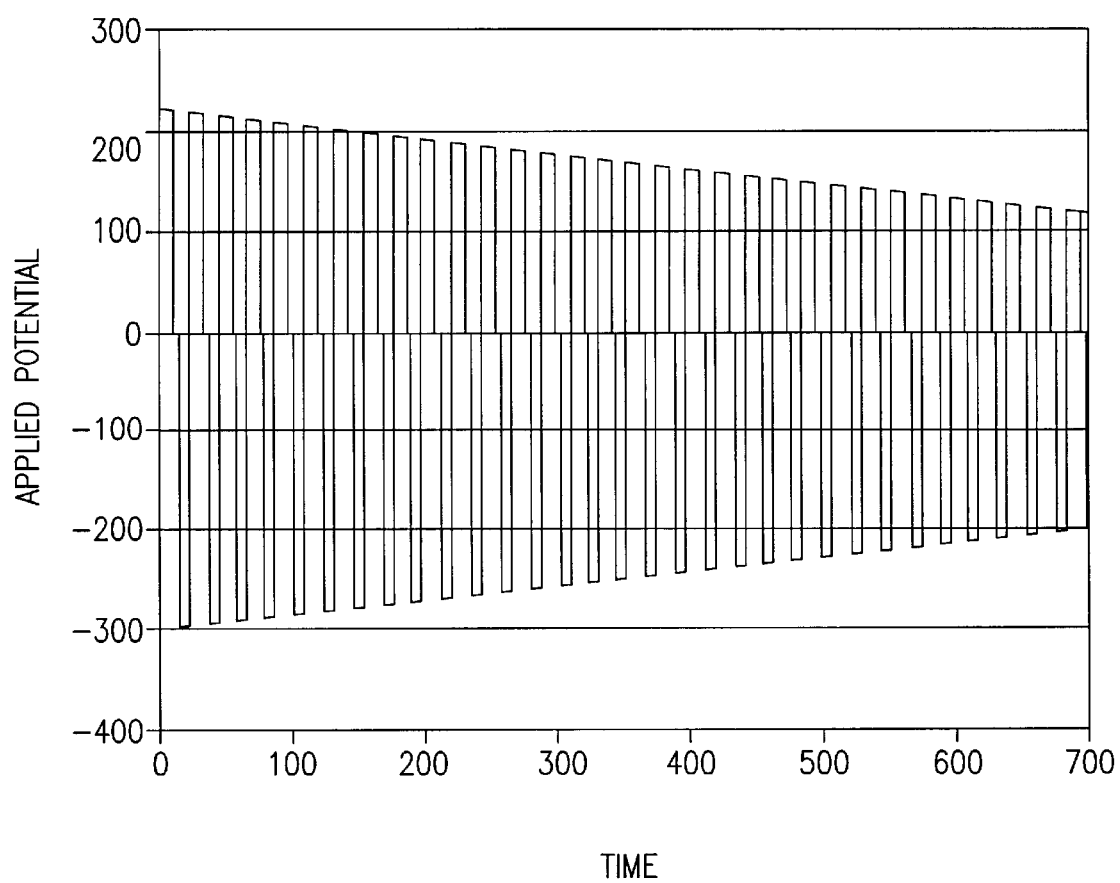
FIG. 4 illustrates the progressively decreasing waveform associated with the present method of electroplating.

The second element of the method includes varying the amplitude and duration of the voltage applied to the electroplating cell. More specifically, the amplitude-varying feature employs variable amplitude programmed decay. FIG. 4 illustrates the progressively decreasing waveform associated with the varied amplitude. The amplitude of the cathodic and anodic portions of the potential reversal waveform is continuously decreased with increasing time, i.e., decreased as the electrodeposition proceeds from the time of its initiation to the time of its conclusion. The initial high pulse waveform (both plating and deplating) focuses the plating in the center 122 of the low conductivity layer 120. With increasing time, the deposition proceeds outward across the surface of the low conductivity layer 120, i.e., from the center 122 of the low conductivity layer 120 to the edge 123 of the low conductivity layer 120 in order to deposit the metal layer 130. The unit for the time scale depicted in FIG. 4 depends on the frequency of the potential pulse. For example, a waveform at 1 Hz will result in a time scale on FIG. 4 of around 100 seconds. At 1 KHz, the time scale would be only about 1 second on FIG. 4.

As indicated above, the second element of the method also includes varying the duration of the applied potential pulse. The duration of the pulsed voltage may be increased, decreased, or increased and decreased, depending upon the particular application. The duration for each portion of the waveform may be independently controlled. A rest period, shown in FIG. 4, may or may not be needed, depending on the resistance of the material and/or the location of the electroplating on the wafer.

Figure 2:
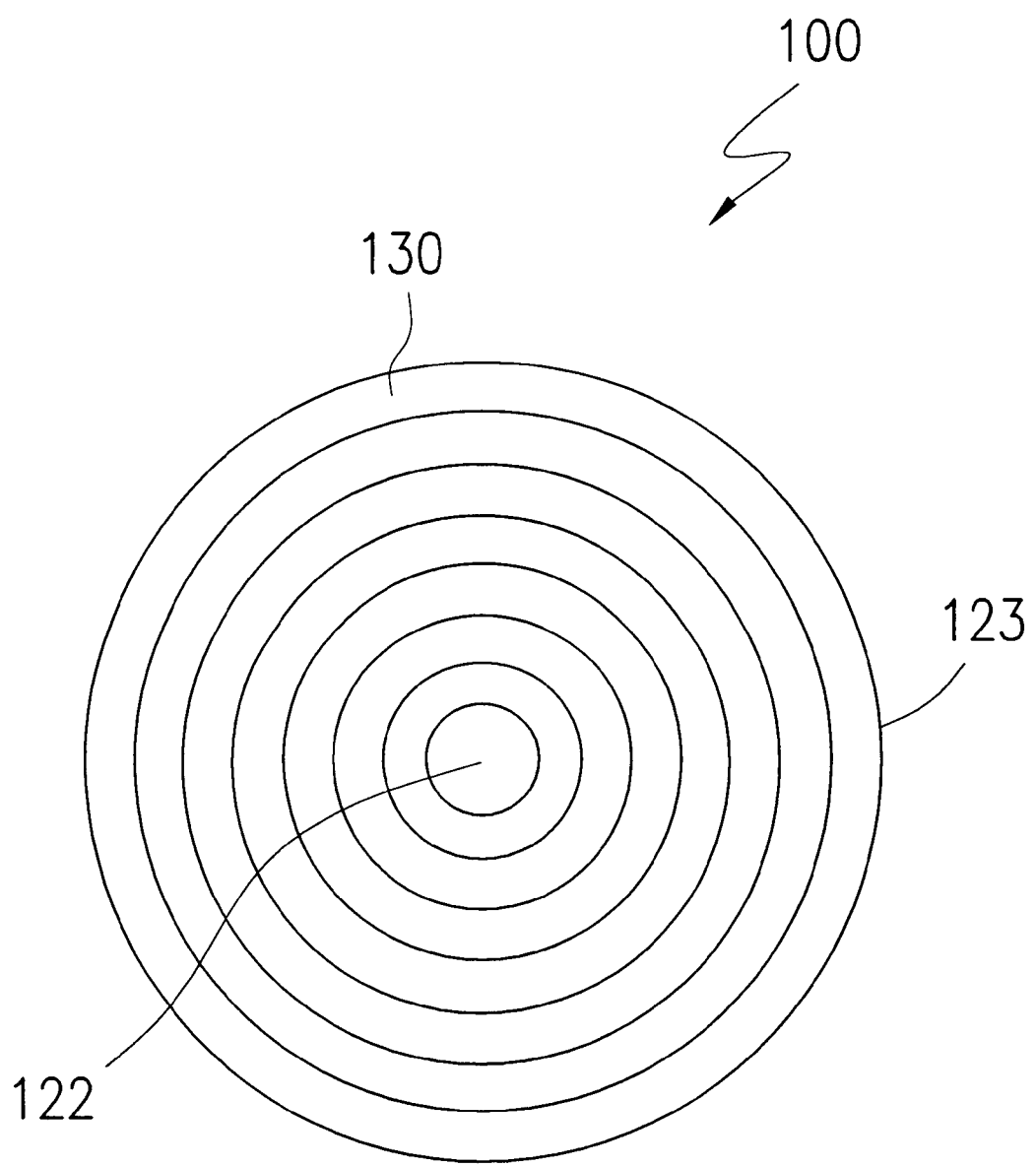
FIG. 2 is a plan view of the wafer depicted in FIG. 1.

The amplitude of the cathodic and anodic portions of the potential reversal waveform is continuously decreased, and the duration of the pulse is varied, in a manner that can provide a metal layer 130 having a desired structure and thickness across the surface of the low conductivity layer 120. As illustrated in FIG. 2, the deposition of metal layer 130 proceeds from the center 122 of the low conductivity layer 120 to the outside edge 123 of the low conductivity layer 120 in an approximately concentric ring configuration. In a typical embodiment, the metal layer 130 has a uniform thickness, from the center 122 of the low conductivity layer 120 to the outside edge 123 of the low conductivity layer 120, of from about 50 angstroms to about 3000 angstroms. Thus, by virtue of the ability to vary the amplitude and duration in a specific combination, a predetermined profile of deposited metal layer 130 across the surface of low conductivity layer 120 can be achieved.

Figure 5A:
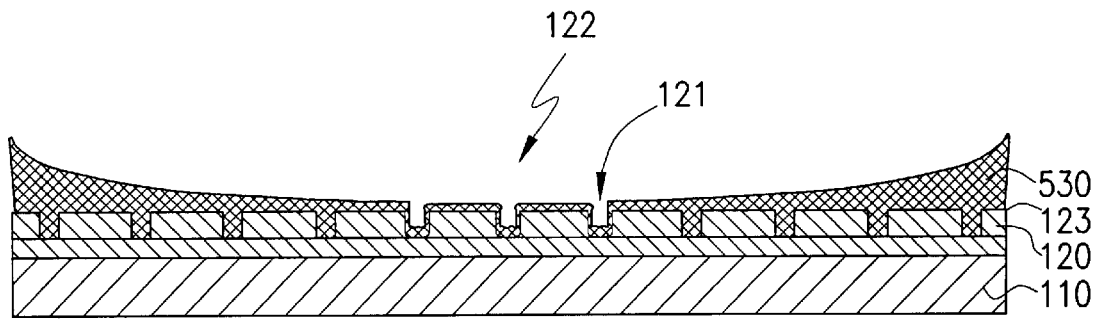
FIGS. 5A–R illustrate details of the method of depositing the metal layer depicted in FIG. 1.
Figure 5B:
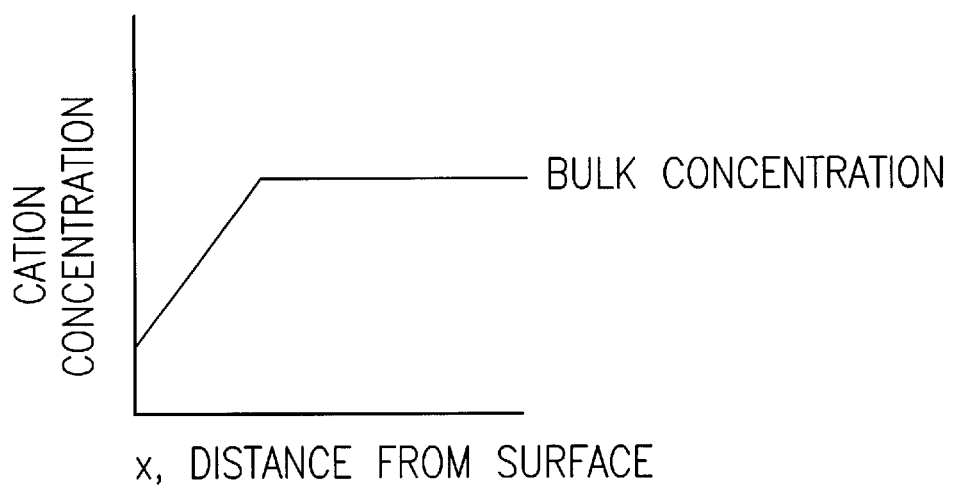
Figure 5C:
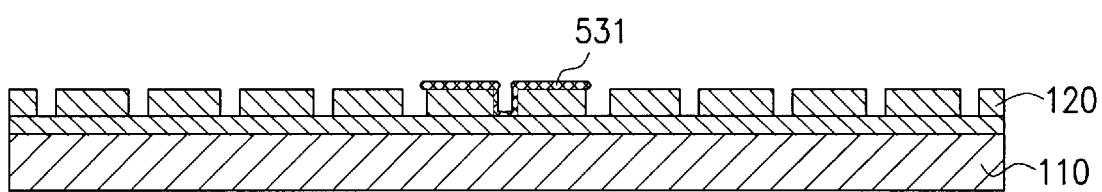
Figure 5D:
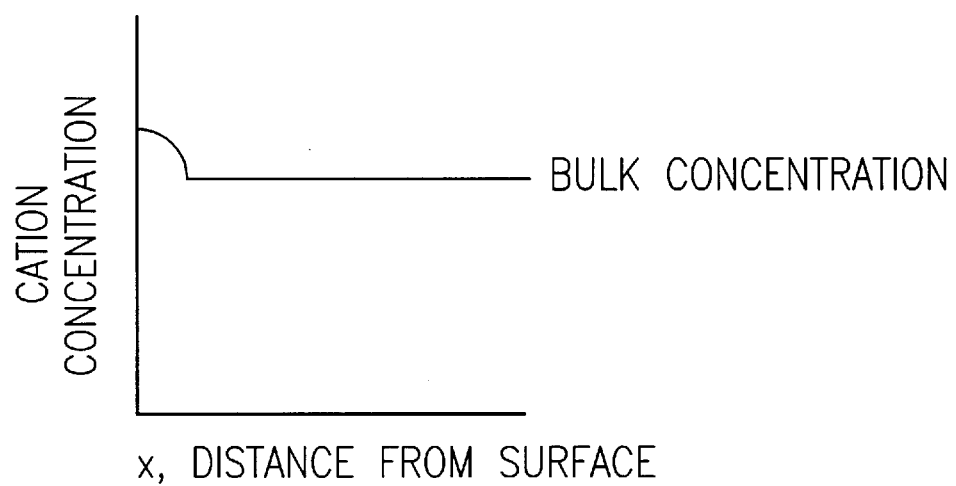
Figure 5E:
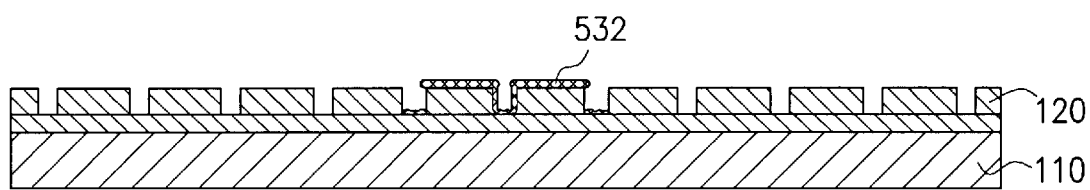
Figure 5F:
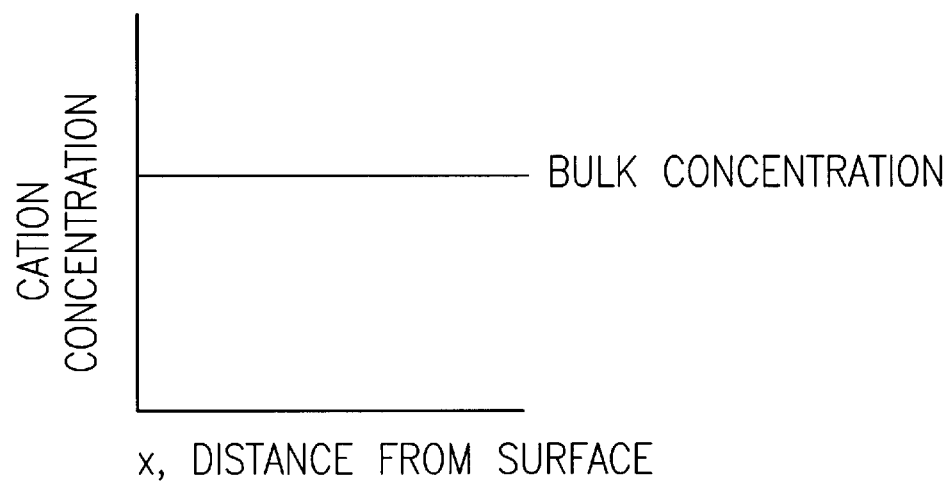
Figure 5G:
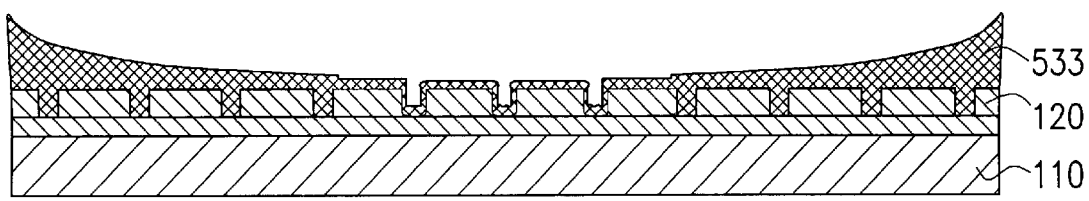
Figure 5H:
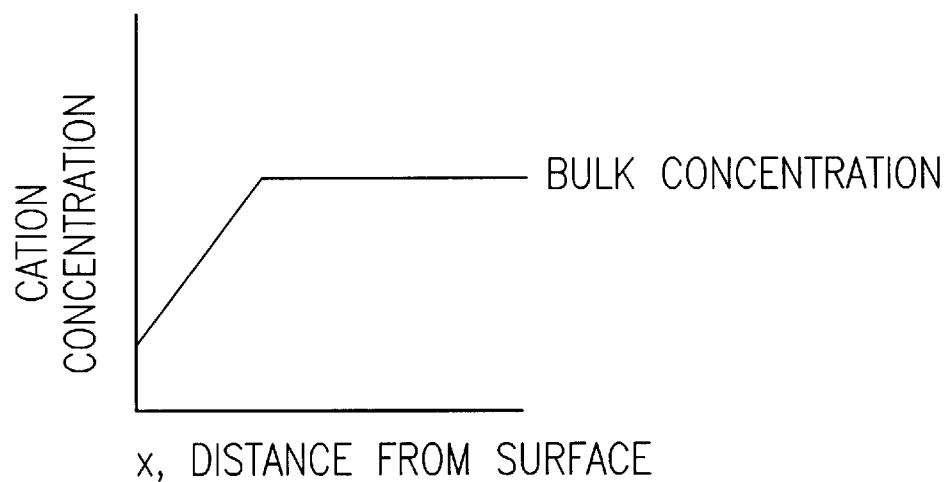
Figure 5I:
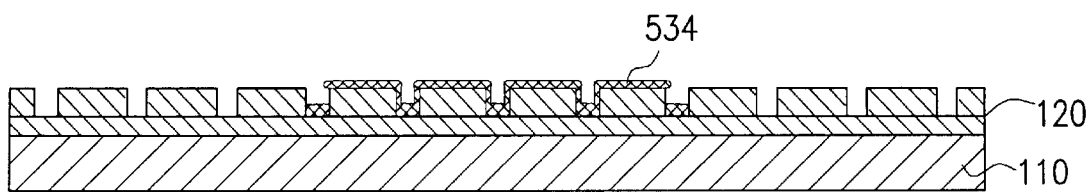
Figure 5J:
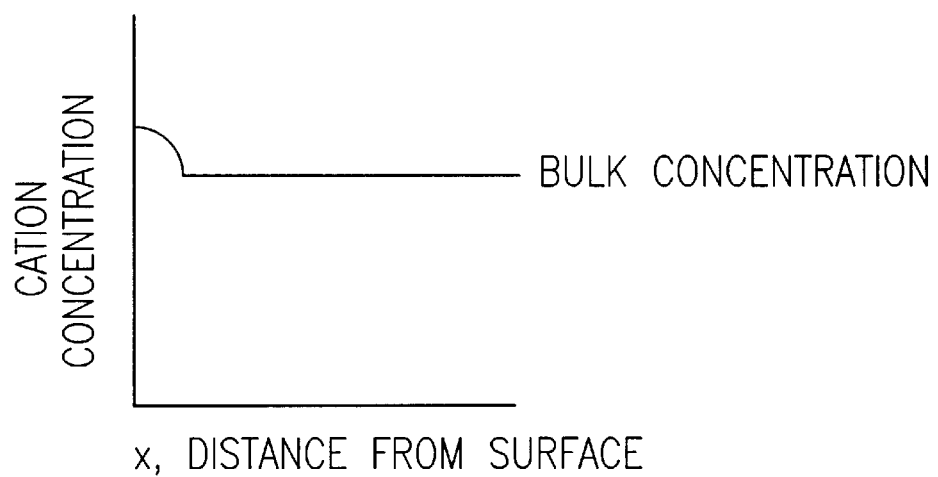
Figure 5K:
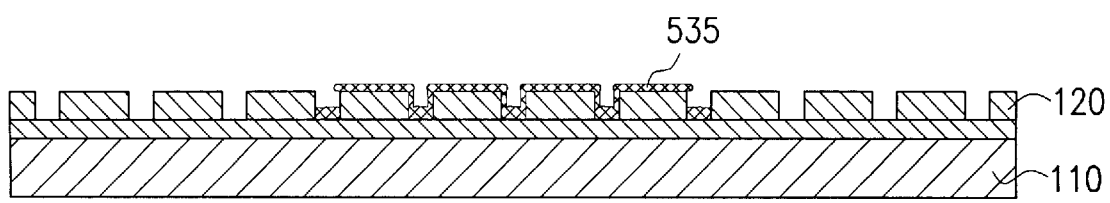
Figure 5L:
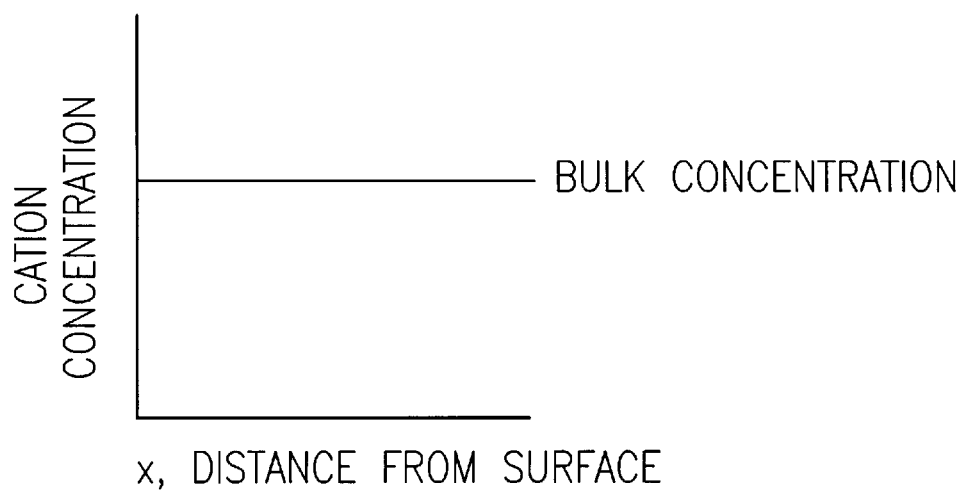
Figure 5M:
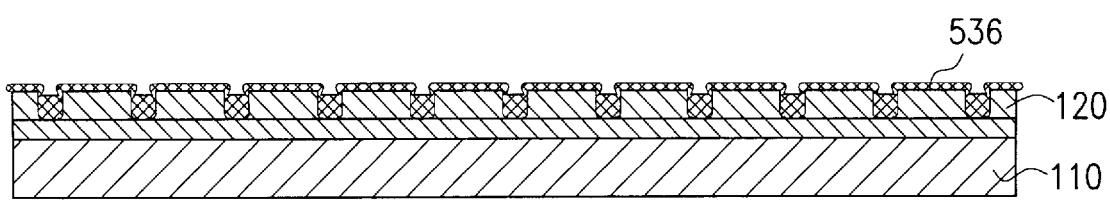
Figure 5N:
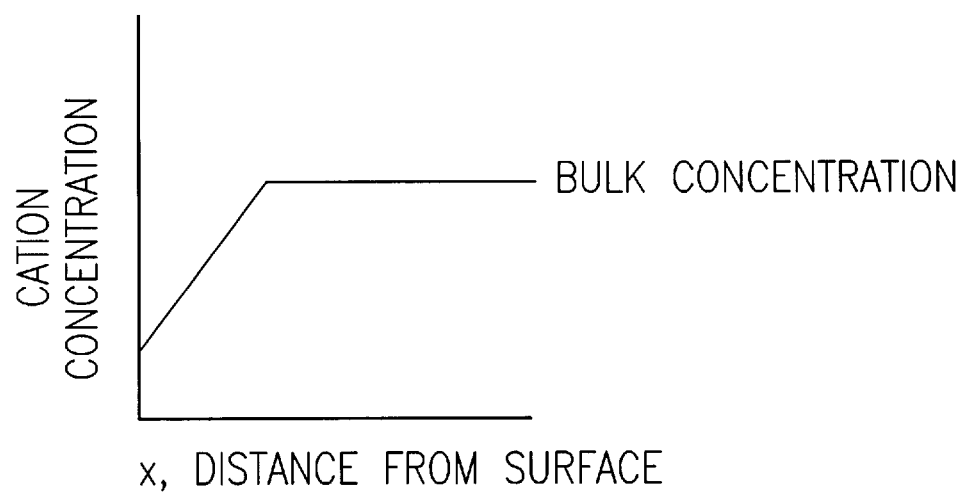
Figure 5O:
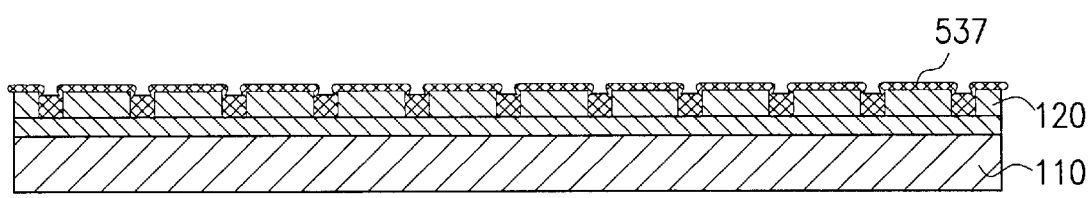
Figure 5P:
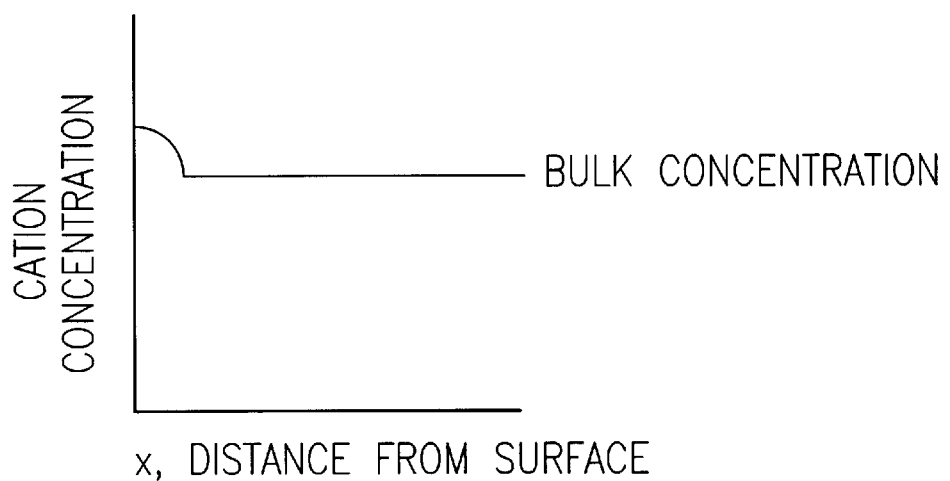
Figure 5Q:
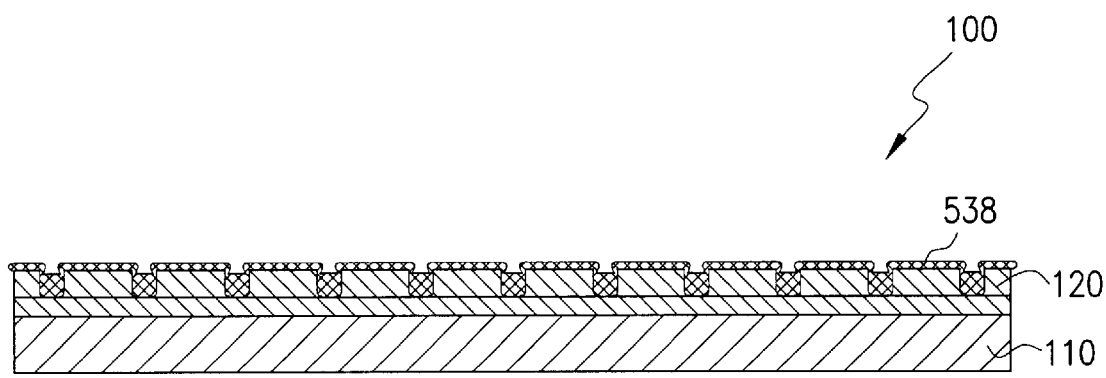
Figure 5R:
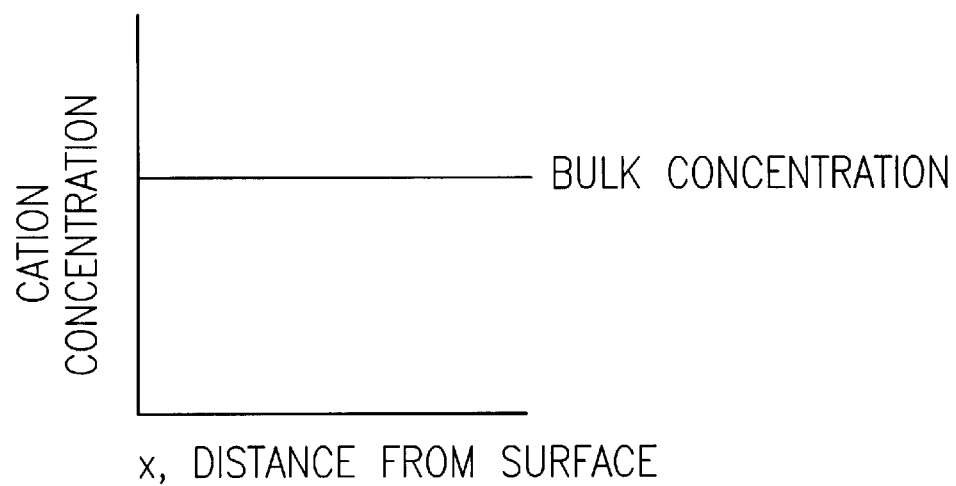

Details of the method of depositing a metal layer 538 (analogous to the metal layer 130 depicted in FIG. 1) are illustrated in FIGS. 5A–R. FIGS. 5A–R thus provide a "snapshot" view at different times of the ring-type plating that is characteristic of the present method. FIGS. 5A, 5C, 5E, 5G, 5I, 5K, 5M, 5O, and 5Q provide a partial cross-sectional view of the wafer 100 as the electrodeposition proceeds. FIGS. 5B, 5D, 5F, 5H, 5J, 5L, 5N, 5P, and 5R provide a graphical illustration of the cation concentration versus distance from the surface of low conductivity layer 120 during the stages of deposition represented by FIGS. 5A, 5C, 5E, 5G, 5I, 5K, 5M, 5O, and 5Q respectively. In FIGS. 5B, 5D, 5F, 5H, 5J, 5L, 5N, 5P, and 5R, the term "bulk concentration" refers to the nominal concentration of the electroplating solution, i.e., the concentration of copper cations sufficiently far enough away from the electrode surface that the concentration is fixed.

FIGS. 5A–F represent the initial stage of the electrodeposition process, i.e., that point at which the process focuses the plating in the center 122 of the low conductivity layer 120. FIGS. 5A and 5B correspond to the largest amplitude for the forward voltage pulse. FIGS. 5C and 5D correspond to the largest forward and reverse voltage amplitudes during the deplating pulse. FIGS. 5E and 5F correspond to the largest amplitude of the forward pulse during the rest period.

FIGS. 5G–L represent an intermediate stage of the electrodeposition process, i.e., that point at which the plating is focused at a point intermediate between the center 122 and the edge 123 of the low conductivity layer 120. FIGS. 5G and 5H correspond to a mid-range amplitude for the forward voltage pulse. FIGS. 5I and 5J correspond to mid-range forward and reverse voltage amplitudes during the deplating pulse. FIGS. 5K and 5L correspond to the mid-range forward and reverse voltage amplitudes during the rest period.

FIGS. 5M–R represent the final stage of the electrodeposition process, i.e., that point at which the plating is focused at a point near the edge 123 of the low conductivity layer 120. FIGS. 5M and 5N correspond to the smallest amplitude for the forward voltage pulse. FIGS. 5O and 5P correspond to the end of the forward and reverse pulses during the deplating step. FIGS. 5Q and 5R correspond to the end of the forward and reverse pulses during the rest period.

As is evident from FIGS. 5A–R, the initial high pulse waveform (both plating and deplating) focuses the plating in the center 122 of the low conductivity layer 120. The amplitude of both the cathodic and anodic portion of the waveform, however, is then continuously decreased, and the duration of the pulse varied, in a manner that will provide a predetermined deposition profile across the surface of the low conductivity layer 120. With time, therefore, the deposition zone proceeds to the outside edge in a ring-type configuration (see also FIG. 2). The relaxation of the surface from the rest period with a pulse-type wave provides for more conformal plating at the beginning of the plating process. The changing pulse amplitude and duration facilitates control of the uniformity of deposition and the final fill of structures such as damascene feature 121. The changing of the amplitude of the forward and reverse cycle facilitates filling structures in the center 122 of the low conductivity layer 120 without overdepositing on the outside edge 123.

Furthermore, since a pulse reverse type waveform is incorporated into the total waveform, enhanced fill from the bottom up occurs. Thus, for example, the method facilitates the fill of a trench to provide features such as damascene feature 121. The rest period keeps the electrodeposition process at a non-diffusion-limited regime for plating and may allow the organic additives to redistribute onto the appropriate sites.

The frequency of the voltage pulse is typically from about 1 Hz to about 100 KHz. Use of a higher frequency will typically not allow significant movement of the metal atoms. The range of applied potential amplitudes that is employed depends upon certain variables associated with the electrodeposition process. For example, potentials for electrochemical cells are typically compared using a reference electrode in order to compensate for the resistance drop associated with the cell design. There is also a resistance drop associated with the low conductivity layer 120, which is a function of both the low conductivity material and its thickness. If the interface of the electrodes results in a drop of more than about 2 volts, the electrolyte will break down with the evolution of hydrogen or oxygen. Therefore, in a typical embodiment of the present method, the amplitude can range from several tenths of a volt for very conductive films with good cell designs, to about 5 volts. The potential drop across the surface of the low conductivity layer 120 is dependent upon the thickness of the layer 120. For example, when layer 120 is tungsten, the potential drop is from 3–5 ohms/sq.

In an optional embodiment, the method may further include pretreatment of the low conductivity layer 120 prior to initiating the electroplating process. For example, the pretreatment could be employed to clean the surface of the low conductivity layer 120, such as for example, by using ammonium hydroxide or hydrofluoric acid to remove oxide from a tungsten barrier layer.

Thus, the present method takes advantage not only of the relaxation (i.e., the mass transport of copper to the surface) of the metal layer 130, but of the variable potential across the surface of the layer 120 of low conductivity material created by the IR drop of the low conductivity layer. Combining these features allows one to control both the deposition location and the deposition quantity of the metal layer 130.

A second embodiment of the present method utilizes the combination of two elements: a current reversal waveform, and variation in the amplitude and duration of the applied current pulse. The first element of the second embodiment of the method includes applying a pulsed periodic reverse current comprising a sequential forward to reverse, reverse to forward, continuously repeating pulsing sequence across the electrodes of the electroplating cell. The pulsing sequence utilizes a current reversal waveform having a peak reverse current density and a peak forward current density. The second element of the second embodiment of the method includes varying the amplitude and duration of the current applied to the electroplating cell.

The preferred chemistry of the electroplating solution is a complexed basic bath in which the potential obtained during the cathodic portion of the waveform is capable of reducing oxide on the surface of the barrier without significant metal plating. The electrodeposition of metal layer 130 is effected in an electroplating cell utilizing a completed basic solution which comprises an aqueous basic metal electrolyte. Depending upon the particular structure desired, the metal that is deposited according to the present method may be most any metal that can be electrodeposited from aqueous chemistries, such as, for example, Cu, Ni, Au, Cr, Ag, Pt, and Ir. If the electrodeposited metal is copper, for example, the copper electrolyte can be cupric sulfate.

In one embodiment of the method for the electrodeposition of copper, the electroplating solution (i.e., "bath") includes a complexed basic solution comprising cupric sulfate and a solution of ethylenediamine tetraacetic acid ("EDTA") and tetramethylammonium hydroxide ("TMAH"). In this embodiment, the bath comprises a solution of from about 1 to about 10 g/l of $CuSO_4$, typically from about 5 to about 6 g/l of $CuSO_4$, in from about 35 to about 45 g/l of EDTA, typically from about 40 to about 43 g/l of EDTA. The bath also typically comprises from about 1 to about 5 ml (per liter of electroplating solution) of a surfactant, such as TRITON X-100 (commercially available from Union Carbide), and from about 20 to about 100 ml of 25% TMAH. In an optional embodiment, the electroplating solution may comprise a citric acid solution or other metal complexing acid bath.

Figure 3:
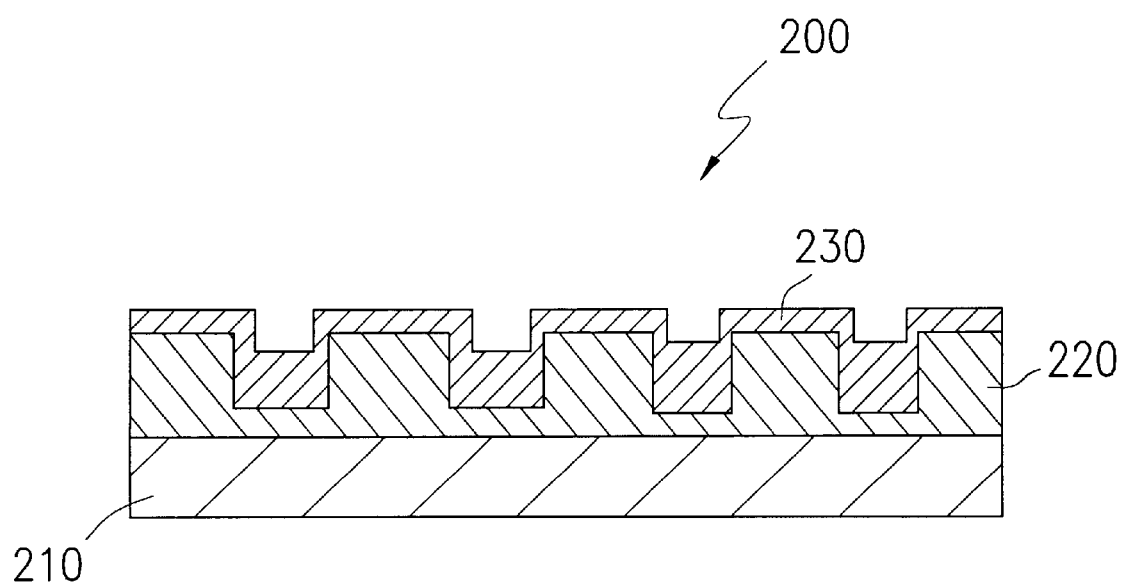
FIG. 3 is a partial cross-sectional view of a chip produced from the wafer depicted in FIG. 1.

FIG. 3 is a partial cross-sectional view of a chip 200 produced from the wafer depicted in FIG. 1. Chip 200 includes a substrate 210 and a metal layer 230 deposited on a low conductivity layer 220. Chip 200 may then be incorporated in any fabricated semiconductor device, including various processor system components, such as for example, a central processing unit ("CPU") or in any of the various types of memory devices, such as for example, RAM, ROM, and others. It may also be used in any type of integrated circuit controller for a floppy disk, a hard disk, a ZIP, or a CD-ROM disk.

Figure 6:
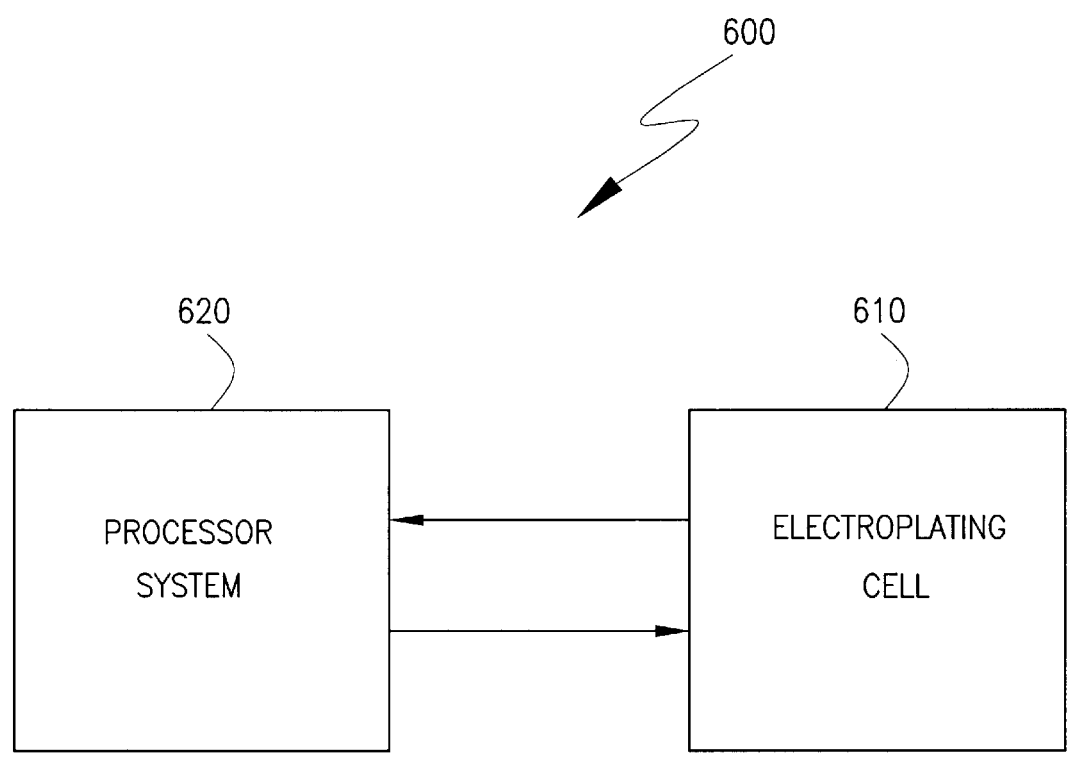
FIG. 6 is a block diagram of a system for depositing the metal layer depicted in FIG. 1.

FIG. 6 is a block diagram of a system 600 for depositing the metal layer depicted in FIG. 1. The system 600 comprises an electroplating cell 610, and a processor system 620. The processor system 620 is capable of operating the electroplating cell 610 so as to provide a layer of electroplated metal 130 having uniform structure and thickness across the surface of the low conductivity layer 120. The variable amplitude programmed decay, and the variation in pulse duration, are effected through control of the power supply associated with the electroplating cell 610. For example, processor system 620 and the associated software may be employed to control the power supply by sending a digital or analog signal to effect a particular rate of decay. The decay rate can be determined by any of various mathematical functions, such as, for example, a linear or exponential decay function, or another function capable of effecting a particular decay rate. Any particular decay rate is dependent upon the material of metal layer 130, the thickness of the deposited metal layer 130, the material and thickness of the low conductivity layer 120, and the chemistry of the electroplating solution.

Figure 7:
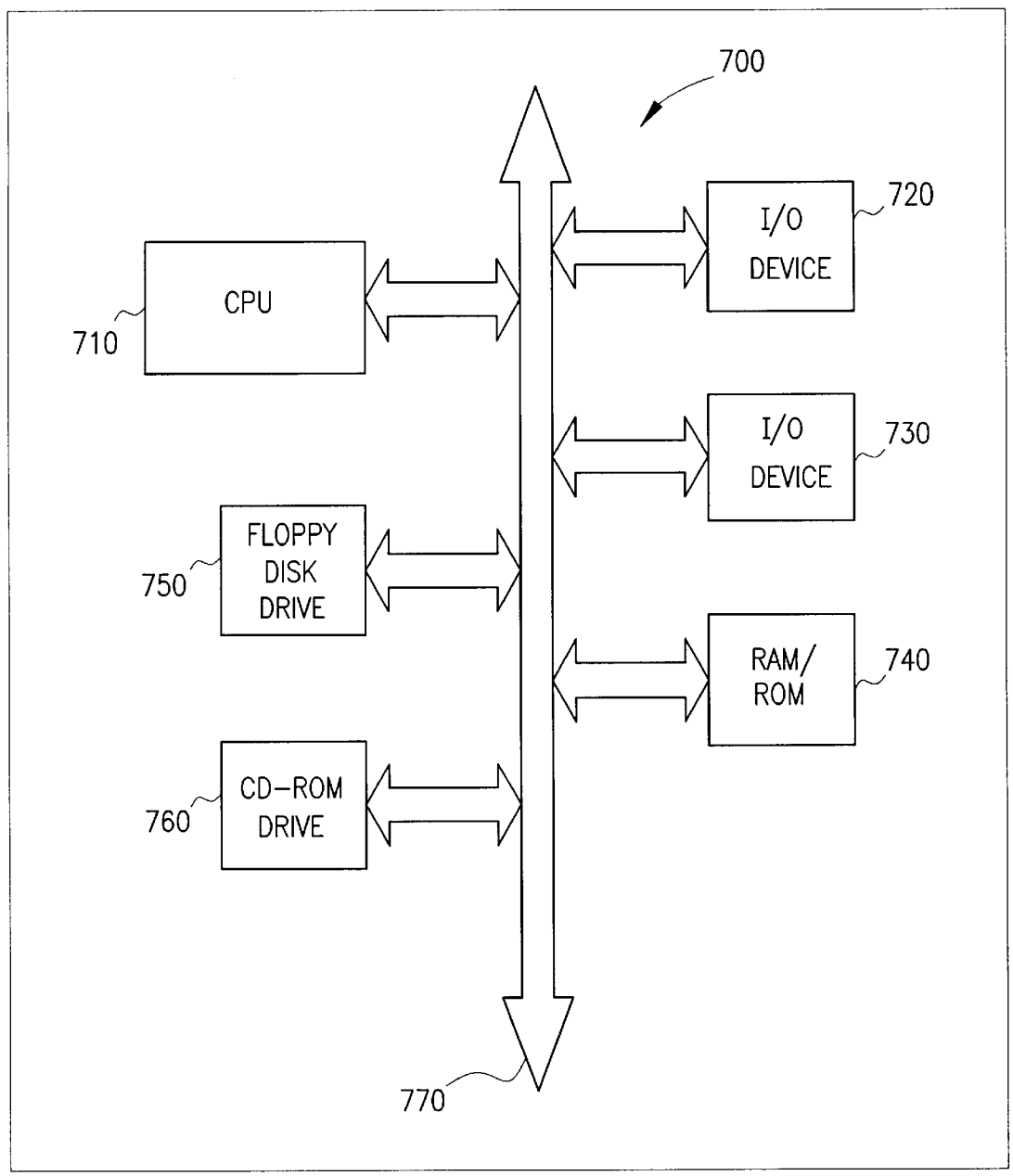
FIG. 7 is a block diagram of a system which employs the chip shown in FIG. 3.

FIG. 7 is a block diagram of a system 700 utilizing a chip 200 (see FIG. 3) comprising a layer of metal deposited in accordance with the present invention. System 700 typically comprises a CPU 710. The system 700 may be a computer system, a process control system, or any other system employing a processor and associated memory, and may employ one or more buses and/or bridges which allow the CPU 710 to internally communicate with I/O devices 720, 730, random access memory (RAM) devices and read-only memory (ROM) devices 740, and peripheral devices such as a floppy disk drive 750 and a compact disk CD-ROM drive 760 that also communicate with CPU 710 over the bus 770, as is well known in the art. As discussed above with respect to chip 200, any of the CPU 710, the memory devices, and controller elements of other illustrated electrical components may include a chip 200 having a layer of electrode-posited metal 230 deposited in accordance with the claimed invention.

The present invention, therefore, provides a method of electroplating, and a layer of electroplated metal deposited therewith, that are suitable for deposition on a layer of low conductivity material. By virtue of the ability to vary the amplitude and duration of the applied potential or current pulse, the method facilitates the filling of structures in the center of the low conductivity layer without overdepositing on the outside edge, thus ensuring a controlled deposition of material across the entire surface of the low conductivity layer.

Although the invention has been described and illustrated as being suitable for use in semiconductor applications, for example, processor systems and memory devices, the invention is not limited to these embodiments. Rather, the invention could be employed in any service requiring controlled uniformity of an electrodeposited metal onto a layer of low conductivity material.

Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the following claims.

What is claimed as new and desired to be protected by Letters Patent of the United States is:

1. A method of electroplating metal onto a layer of low conductivity material, said method comprising:
applying a pulsed periodic reverse potential comprising a sequential forward to reverse, reverse to forward, continuously repeating pulsing sequence across the electrodes of an electroplating cell utilizing a potential reversal waveform having a peak forward potential density and a peak reverse potential density; and
varying the amplitude and duration of the applied potential of the cathodic and anodic portions of the potential reversal waveform to deposit a layer of electroplated metal.

2. The method of claim 1, wherein said amplitude of the applied potential is continuously decreased over time at a rate capable of depositing said layer of electroplated metal with a desired uniform structure and thickness across the surface of said low conductivity layer.

3. The method of claim 1, wherein said deposition proceeds from the center of the surface of said low conductivity layer to the edge of the surface of said low conductivity layer.

4. The method of claim 3, wherein the deposition has an approximately concentric ring configuration.

5. The method of claim 1, wherein said duration of the applied potential is decreased.

6. The method of claim 1, wherein said duration of the applied potential is increased.

7. The method of claim 2, wherein said uniform thickness is from about 50 angstroms to about 3000 angstroms.

8. The method of claim 1, wherein the frequency of said potential pulse is from about 1 Hz to about 100 KHz.

9. The method of claim 1, wherein said amplitude is from about 0.5 V to about 5 V.

10. The method of claim 1, wherein said electroplating is effected in a complexed basic solution.

11. The method of claim 10, wherein said completed basic solution comprises an aqueous basic metal electrolyte.

12. The method of claim 11, wherein said metal is selected from the group consisting of Cu, Ni, Au, Cr, Ag, Pt, and Ir.

13. The method of claim 12, wherein said metal is Cu.

14. The method of claim 11, wherein said aqueous basic metal electrolyte is cupric sulfate.

15. The method of claim 11, wherein said complexed basic solution comprises a solution of from about 1 to about 10 g/l of cupric sulfate.

16. The method of claim 15, wherein said complexed basic solution comprises a solution of from about 5 to about 6 g/l of cupric sulfate.

17. The method of claim 11, wherein said complexed basic solution comprises a solution of EDTA and TMAH.

18. The method of claim 17, wherein said EDTA and TMAH solution comprises from about 35 to about 45 g/l of EDTA.

19. The method of claim 18, wherein said EDTA and TMAH solution comprises from about 40 to about 43 g/l of EDTA.

20. The method of claim 17, wherein said EDTA and TMAH solution comprises from about 20 to about 100 ml of 25% TMAH.

21. The method of claim 11, wherein said complexed basic solution further comprises a surfactant.

22. The method of claim 10, wherein said complexed basic solution comprises citric acid.

23. The method of claim 1, wherein said layer of low conductivity material is a barrier layer.

24. The method of claim 1, wherein said low conductivity material is selected from the group consisting of Ta, W, TaN/Ta, TaN, WN, W/WN, TaSiN, and TiSiN.

25. The method of claim 1, further comprising pretreating said low conductivity layer before initiating said electroplating.

26. A method of electroplating metal onto a layer of low conductivity material, said method comprising:
applying a pulsed periodic reverse current comprising a sequential forward to reverse, reverse to forward, continuously repeating pulsing sequence across the electrodes of an electroplating cell utilizing a current reversal waveform having a peak forward current density and a peak reverse current density; and
varying the amplitude and duration of the applied current of the cathodic and anodic portions of the current reversal waveform to deposit a layer of electroplated metal.

27. A method of electroplating metal onto a layer of low conductivity material, said method comprising:
applying a pulsed periodic reverse potential waveform comprising a sequential forward to reverse, reverse to forward, continuously repeating pulsing potential across the electrodes of an electroplating cell utilizing a potential waveform having a peak forward potential and a peak reverse potential; and
varying the amplitude and duration of the applied potential of the cathodic and anodic portions of the potential waveform to deposit a layer of electroplated metal.

28. A method of electroplating metal onto a layer of low conductivity material, said method comprising:
applying a pulsed periodic reverse current controlled waveform comprising a sequential forward to reverse, reverse to forward, continuously repeating pulsing current across the electrodes of an electroplating cell utilizing a current controlled waveform having a peak forward current and a peak reverse current; and
varying the amplitude and duration of the applied current of the cathodic and anodic portions of the current waveform to deposit a layer of electroplated metal.

* * * * *